US011164727B2

(12) United States Patent
Xie et al.

(10) Patent No.: US 11,164,727 B2
(45) Date of Patent: Nov. 2, 2021

(54) PROCESSING OF WORKPIECES USING HYDROGEN RADICALS AND OZONE GAS

(71) Applicants: Mattson Technology, Inc., Fremont, CA (US); Beijing E-Town Semiconductor Technology Co., Ltd., Beijing (CN)

(72) Inventors: Ting Xie, Fremont, CA (US); Hua Chung, Saratoga, CA (US); Bin Dong, Fremont, CA (US); Xinliang Lu, Fremont, CA (US); Haichun Yang, San Jose, CA (US); Michael X. Yang, Palo Alto, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 0 days.

(21) Appl. No.: 16/928,220

(22) Filed: Jul. 14, 2020

(65) Prior Publication Data
US 2021/0020413 A1 Jan. 21, 2021

Related U.S. Application Data

(60) Provisional application No. 62/875,566, filed on Jul. 18, 2019.

(51) Int. Cl.
*H01J 37/32* (2006.01)
*H01L 21/311* (2006.01)

(52) U.S. Cl.
CPC .. *H01J 37/32449* (2013.01); *H01L 21/31138* (2013.01); *H01L 21/31144* (2013.01)

(58) Field of Classification Search
CPC .......... H01J 37/32449; H01L 21/31105; H01L 21/3065; H01L 21/31116; H01L 21/31138; H01L 21/31144
USPC ............... 438/706, 710, 712, 714, 717, 723; 156/345.3, 345.34, 345.38
See application file for complete search history.

(56) References Cited

U.S. PATENT DOCUMENTS

| | | | |
|---|---|---|---|
| 4,201,579 A | 5/1980 | Robinson et al. | |
| 6,235,453 B1 | 5/2001 | You et al. | |
| 6,426,304 B1 | 7/2002 | Chien et al. | |
| 6,693,043 B1 | 2/2004 | Li et al. | |
| 7,226,852 B1 | 6/2007 | Li et al. | |

(Continued)

FOREIGN PATENT DOCUMENTS

WO WO 2012/018375 2/2012

OTHER PUBLICATIONS

International Search Report and Written Opinion for Application No. PCT/US2020/041907, dated Oct. 27, 2020, 12 pages.

*Primary Examiner* — Lan Vinh
(74) *Attorney, Agent, or Firm* — Dority & Manning, P.A.

(57) ABSTRACT

Processes for removing photoresist layer(s) from a workpiece, such as a semiconductor are provided. In one example implementation, a method for processing a workpiece can include supporting a workpiece on a workpiece support. The workpiece can have a photoresist layer and a low-k dielectric material layer. The method can include performing a hydrogen radical etch process on the workpiece to remove at least a portion of the photoresist layer. The method can also include exposing the workpiece to an ozone process gas to remove at least a portion of the photoresist layer.

16 Claims, 12 Drawing Sheets

(56) References Cited

U.S. PATENT DOCUMENTS

| | | |
|---|---|---|
| 7,585,777 B1 | 9/2009 | Goto et al. |
| 8,591,661 B2 | 11/2013 | Cheung et al. |
| 9,390,941 B2 * | 7/2016 | Watanabe ......... H01J 37/32807 |
| 2004/0154743 A1 * | 8/2004 | Savas ................ G03F 7/427 |
| | | 156/345.5 |
| 2007/0117397 A1 | 5/2007 | Fu et al. |
| 2008/0083500 A1 | 4/2008 | Sakuragi et al. |
| 2009/0014414 A1 * | 1/2009 | Tomioka ........... H01L 21/76814 |
| | | 216/41 |
| 2014/0120726 A1 * | 5/2014 | Nemani ............ H01L 21/31138 |
| | | 438/694 |
| 2014/0151334 A1 * | 6/2014 | Matsumoto ............. C01B 32/16 |
| | | 216/69 |
| 2017/0243737 A1 | 8/2017 | Tanigaki et al. |
| 2019/0189420 A1 | 6/2019 | Gao et al. |

* cited by examiner

PROCESSING OF WORKPIECES USING HYDROGEN RADICALS AND OZONE GAS

PRIORITY CLAIM

The present application claims the benefit of priority of U.S. Provisional Application Ser. No. 62/875,566, titled "Processing of Workpieces Using Hydrogen Radicals and Ozone Gas," filed Jul. 18, 2019, which is incorporated herein by reference for all purposes.

FIELD

The present disclosure relates generally to semiconductor processing.

BACKGROUND

Plasma strip processes (e.g., dry strip processes) can be used in semiconductor fabrication as a method for removing photoresist and/or other materials patterned on a workpiece during semiconductor fabrication. Plasma strip processes can use reactive species (e.g., radicals) extracted from a plasma generated from one or more process gases to etch and/or remove photoresist and other mask layers from a surface of a workpiece. For instance, in some plasma strip processes, neutral species from a plasma generated in a remote plasma chamber pass through a separation grid into a processing chamber. The neutral species can be exposed to a workpiece, such as a semiconductor wafer, to remove photoresist from the surface of the workpiece.

SUMMARY

Aspects and advantages of embodiments of the present disclosure will be set forth in part in the following description, or may be learned from the description, or may be learned through practice of the embodiments.

In some aspects of the present disclosure, provided are methods for processing a workpiece. The method can include placing the workpiece in a processing chamber. The workpiece may comprise a photoresist layer and a low-k dielectric material layer. The method can include generating one or more species from a process gas using a plasma induced in a plasma chamber. The process gas may include a hydrogen gas. The method can include filtering the one or more species to create a filtered mixture. The filtered mixture may comprise one or more hydrogen radicals. The method may include exposing the photoresist layer to the hydrogen radicals in the processing chamber such that the hydrogen radicals at least partially etch the photoresist layer.

Some aspects of the present disclosure are directed to methods for processing a workpiece. The method may include placing the workpiece in a processing chamber. The workpiece may include a photoresist layer and a low-k dielectric material layer. The method may include admitting an ozone process gas in to the processing chamber and exposing the workpiece to the ozone process gas such that the ozone process gas at least partially etches the photoresist layer.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1A:
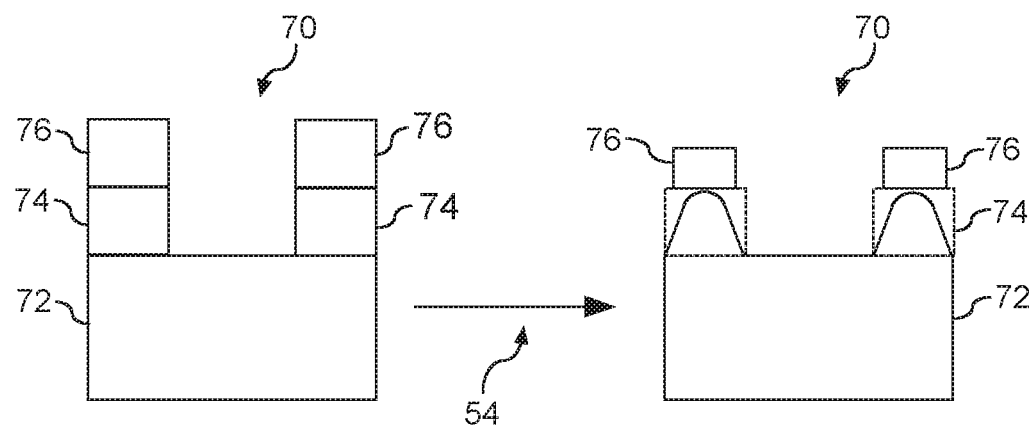
FIGS. 1A and 1B depict an example photoresist removal process according to conventional techniques.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods for processing a workpiece to selectively remove photoresist and/or other mask materials from the surface the workpiece in preparation for further processing. More specifically, aspects of the present disclosure are directed to removal and/or etch of photoresist materials on workpieces having low-k dielectric materials. For instance, reactive species extracted from a plasma can be used to at least partially etch and/or remove photoresist on a surface of a workpiece, such as a semiconductor wafer. The workpiece may also be exposed to an ozone gas to facilitate removal of the photoresist.

Carbon-containing low-dielectric constant (k) dielectric materials are being increasingly used in semiconductor device fabrication. Low-k dielectric materials can be used in front-end-of-line (FEOL) applications as spacers between gates and sources and/or gates and drains. For instance, SiOCN can be used as a spacer material in front-end-of-line (FEOL) applications in advanced semiconductor devices. Low-k dielectric materials can also be used in back-end-of-line (BEOL) applications, such as part of an interconnect structure (e.g., a Cu interconnect structure). For example, SiOC can be used as interconnect dielectric in back-end-of-line (BEOL) applications.

During the manufacturing of semiconductor integrated circuit devices, porous and non-porous low-k dielectric contact materials are frequently used. The purpose of using low-k dielectric materials can be to reduce the capacitance between the conductive layers. Utilization of the low-k material in this manner may diminish a reactive (e.g., resistive-capacitive (RC)) time delay associated with the high frequency signal transmission along the conductive metal lines. RC time delay can be a major roadblock to prevent the integrated circuits from operating faster and, thus, is a challenge for the design and manufacturing of advanced integrated circuits.

Porous and non-porous low-k dielectric materials can contain organic components, such as methyl groups in a matrix of silicon dioxide. These materials can have carbon and hydrogen atoms incorporated into a silicon dioxide lattice, which lowers the dielectric constant of the material. Conventional processes for photoresist removal may use a plasma formed from a mixture of gases having large amounts of oxygen and/or nitrogen in the plasma. The highly reactive oxygen-based plasma reacts with and oxidizes the organic photoresist to form volatile components that are carried away from the wafer surface. However, the exposure of low-k dielectric materials to these oxygen- and nitrogen-based plasmas can cause damage to the low-k dielectric materials by increasing the dielectric constant of the material significantly. The higher the dielectric constant of the dielectric materials, the higher the capacitance of the dielectric material and the longer RC time delay of the integrated circuit. Furthermore, as the dimensions of semiconductor devices shrink and the use of low-k dielectric materials require lower and lower dielectric constants, these photoresist strip methods may not be suitable for the low-k dielectric materials.

Indeed, carbon-containing low-k dielectric materials, such as porous low-k dielectric materials, can be susceptible to damage by semiconductor fabrication process steps (e.g., oxygen containing plasma dry etch, dry ash, wet clean, chemical mechanical polish (CMP), etc.). Accordingly, there is a need for methods and/or process for removing photoresist from workpieces without causing damage to low-k dielectric materials.

Example aspects of the present disclosure are directed to conducting a photoresist removal process on a workpiece. The photoresist removal process can expose the workpiece to one or more hydrogen radicals. The hydrogen radicals can selectively remove the photoresist relative to the low-k dielectric materials. In this way, damage caused to low-k dielectric materials during the photoresist removal process can be reduced.

In some embodiments, the hydrogen radicals can be generated in a plasma chamber that is separated from the processing chamber by a separation grid. The hydrogen radicals can be generated, for instance, by inducing a plasma in a process gas. The process gas, for instance, can be a mixture including $H_2$ and a carrier gas, such as a mixture including $H_2$ and $N_2$, or can be a mixture including $H_2$ and He, or can be a mixture including $H_2$ and Ar, or can be a mixture including $H_2$ and another inert gas. In some embodiments, the process gas can be a mixture of $H_2$ with an oxygen gas (e.g., $O_2$), wherein the $O_2$ concentration is less than 10% by volume. The addition of a small amount of $O_2$ in the process gas may increase the photoresist etch rate. In some other embodiments, the hydrogen radicals can be generated, for instance, using a heated filament, such as a heated tungsten filament.

In some other embodiments, the hydrogen radicals can be generated using post-plasma gas injection. One or more hydrogen radicals are generated by mixing a hydrogen gas with one or more excited inert gas molecules downstream of a plasma source. For instance, one or more excited inert gas molecules (e.g., excited He molecules) can be generated in a plasma chamber that is separated from a processing chamber by a separation grid. The excited inert gas molecules can be generated, for instance, by inducing a plasma in a process gas using a plasma source (e.g., inductive plasma source, capacitive plasma source, etc.). The process gas can be an inert gas. For instance, the process gas can be helium, argon, xenon, neon, or other inert gas. In some embodiments, the process gas can consist of an inert gas. A separation grid can be used to filter ions generated in the plasma chamber and allow passage of neutral species through holes in the separation grid to the processing chamber for exposure to the workpiece.

In some embodiments, the hydrogen radicals can be generated by mixing hydrogen gas ($H_2$) with the excited species at or below (e.g., downstream) of the separation grid. For instance, in some embodiments, the separation grid can have a plurality of grid plates. The hydrogen gas can be injected into species passing through the separation grid at a location below or downstream of one of the grid plates. In some embodiments, the hydrogen gas can be injected into species passing through the separation grid at a location between two grid plates. In some embodiments, the hydrogen gas can be injected into the species at a location beneath all of the grid plates (e.g., in the processing chamber).

Mixing the hydrogen gas with the excited species from the inert gas can result in the generation of one or more hydrogen radicals, such as neutral hydrogen radicals. The hydrogen radicals can be exposed to a workpiece in the processing chamber to implement the photoresist etch processes according to example embodiments of the present disclosure.

Example aspects of the present disclosure can also include conducting a photoresist removal process on a workpiece by exposing the workpiece to an ozone process gas, e.g. gaseous ozone ($O_3$). The ozone process gas can include $O_3$ and oxygen gas ($O_2$). The photoresist etch process may expose the workpiece to gaseous ozone in order to remove photoresist without causing damage to the low-k dielectric material. In this way, damage caused to low-k dielectric materials during the photoresist removal process can be reduced.

Example aspects of the present disclosure may also be directed to alternating exposing the workpiece to hydrogen radicals and exposing the workpiece to an ozone process gas in order to selectively remove photoresist, while reducing damage or removal of the low-k dielectric material. In some embodiments, alternating exposure of the workpiece to hydrogen radicals and ozone process gas allows for a faster desired etch rate of the photoresist material while minimizing damage or removal of the low-k dielectric material.

Aspects of the present disclosure provide a number of technical effects and benefits. For instance, damage to low-k materials and low-k material loss can be prevented during dry strip photoresist removal processes.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece. Low dielectric constant (e.g., "low-k") dielectric materials can be used in the fabrication of advanced semiconductor devices. A low-k dielectric material can have a dielectric constant of less than about 3.0, such as less than about 2.5, such as less than about 2.2.

Figure 1B:
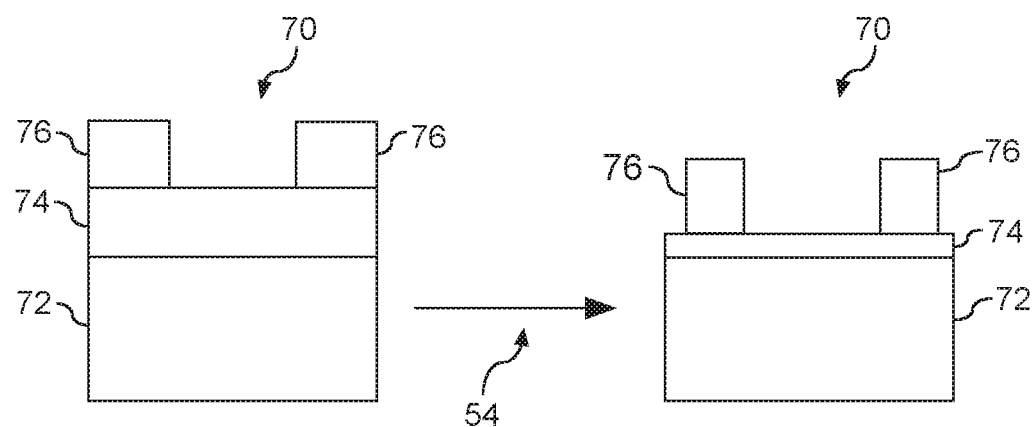

FIG. 1A depicts an overview of an oxygen and/or nitrogen plasma based photoresist removal process 54. As shown, the workpiece 70 includes a substrate 72, a low-k dielectric material layer 74 and a photoresist layer 76. Upon application of the photoresist removal process 54, while certain amounts of the photoresist layer 76 are removed the low-k dielectric material layer 74 experiences damage 60 or an increase in the dielectric constant of the low-k dielectric material layer 74. For instance, the low-k dielectric material layer 74 can be damaged by depletion of methyl ($CH_3$ groups) in exposed surface area (e.g., onside wall, etc.) and replacement of Si—C (carbon) bonds (e.g. Si—$CH_3$ bonds) with Si—O (oxygen) bonds (e.g. Si—OH bonds). The damage can result in an increase of the dielectric constant of the low-k dielectric material layer 74. Further, as shown in FIG. 1B, application of a conventional photoresist removal process 54 can undesirably remove at least a portion of the low-k dielectric material layer 74 from the substrate 72. Although not shown, exposure of the workpiece to photoresist removal process 54 may remove the entire photoresist layer 76 from the workpiece 70.

Figure 2A:
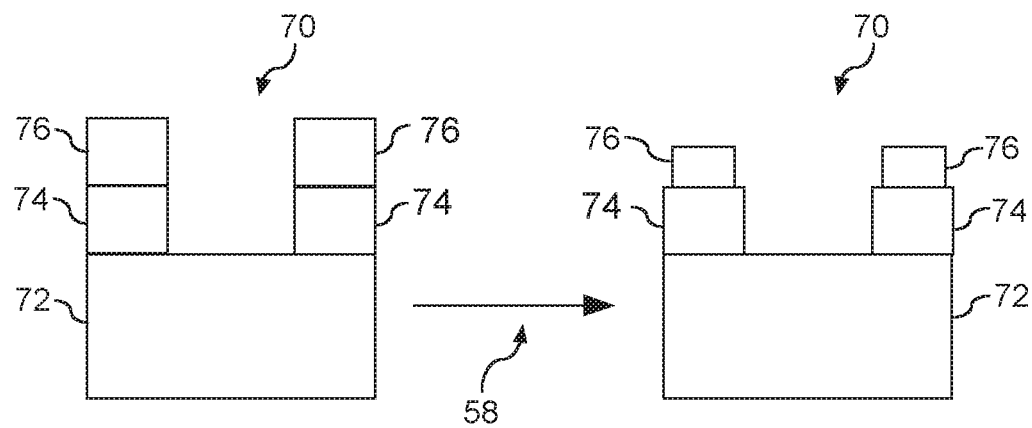
FIGS. 2A and 2B depict an example photoresist removal process according to example embodiments of the present disclosure.
Figure 2B:
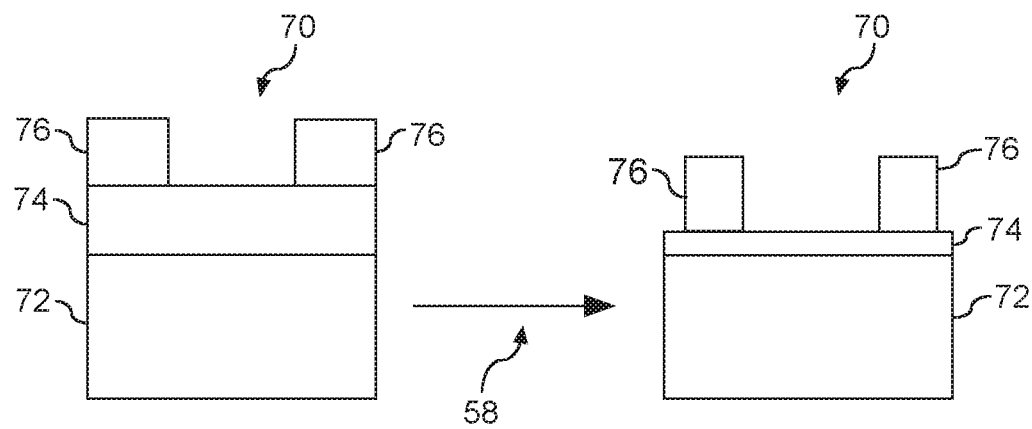

An example photoresist removal process 58 according to example embodiments of the present disclosure are shown in FIGS. 2A and 2B. The photoresist removal process 58 exposes the workpiece to one or more hydrogen radicals and/or ozone gas to remove a portion of the photoresist layer 76. The workpiece 70 can include a substrate layer 72 (e.g. silicon and/or silicon germanium), a low-k dielectric material layer 74, and the photoresist layer 76. The low-k dielectric material layer 74 can additionally include oxygen. In some embodiments, the low-k dielectric material layer 74 can be a silicon oxycarbide (SiOC) layer. In some embodiments, the low-k dielectric material layer 74 can be porous. For instance, the low-k dielectric film layer can have a porosity in the range of about 1% to about 50%. As used herein, "porosity" can be a measure the volume of voids or empty spaces in a material relative to the total volume of the material.

The photoresist removal process 58 can, in some embodiments, include exposing the workpiece 70, including the photoresist layer 76 to hydrogen radicals. The hydrogen radicals can be generated from a process gas using a plasma source, such as an inductively coupled plasma source. The process gas can include hydrogen. The plasma can generate hydrogen radicals. Neutral hydrogen radicals can pass through a separation grid to a processing chamber where they are exposed to the workpiece. The hydrogen radicals can remove at least a portion of the photoresist layer 76 without removing or causing damage to the low-k dielectric material layer 74, as shown in FIGS. 2A and 2B. In some embodiments, the photoresist removal process 58 may remove the entire photoresist layer 76 from the workpiece 70. (Not shown).

Another example photoresist removal process 58 according to example embodiments of the present disclosure, can include exposing the workpiece 70 to an ozone process gas that includes gaseous ozone ($O_3$). In embodiments, the method include exposing the workpiece to the ozone process gas such that the ozone process gas at least partially etches the photoresist layer. Exposure of the workpiece 70 to the ozone process gas selectively removes at least a portion of the photoresist layer 76, while not removing or causing reduced damage to the low-k dielectric material layer 74, as shown in FIGS. 2A and 2B.

In certain embodiments, the workpiece 70 may be exposed to hydrogen radicals or ozone process gas in cyclic and/or alternating fashion to increase the etch rate removal of the photoresist layer 76, while leaving the low-k dielectric material layer 74 substantially intact and without damage. (See FIGS. 2A and 2B).

In some embodiments, the photoresist removal processes 58 according to example embodiments of the present disclosure can be performed in the same processing chamber without having to remove the workpiece from the processing chamber.

Figure 3:
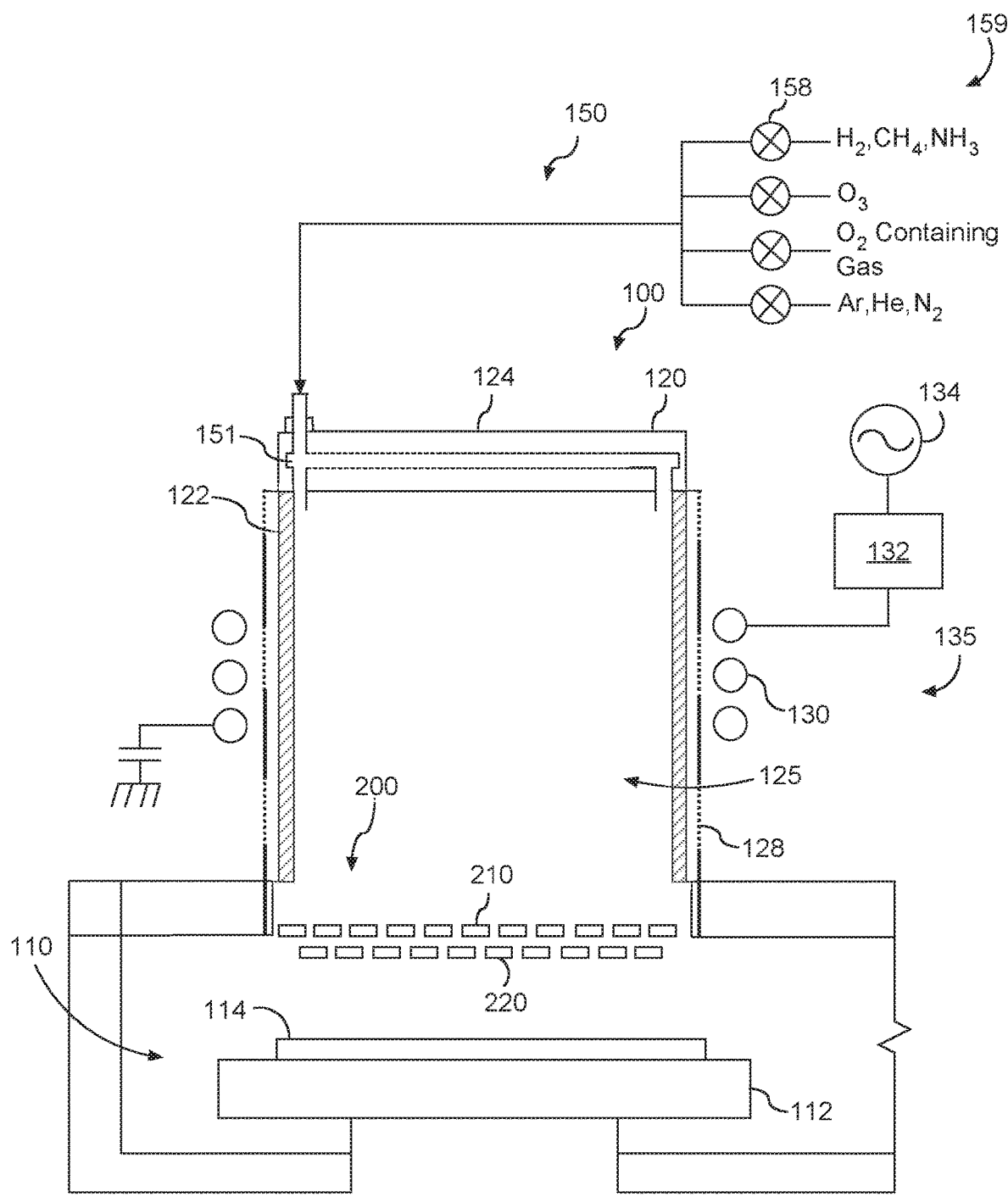
FIG. 3 depicts an example plasma processing apparatus according to example embodiments of the present disclosure.

FIG. 3 depicts an example plasma processing apparatus 100 that can be used to perform processes according to example embodiments of the present disclosure. As illustrated, plasma processing apparatus 100 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., a hydrogen gas or an ozone gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 3, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

As shown in FIG. 3, according to example aspects of the present disclosure, the apparatus 100 can include a gas delivery system 150 configured to deliver ozone gas and process gas to the plasma chamber 120, for instance, via gas distribution channel 151 or other distribution system (e.g., showerhead). The gas delivery system can include a plurality of feed gas lines 159. The feed gas lines 159 can be controlled using valves 158 and/or mass flow controllers to deliver a desired amount of gases into the plasma chamber as process gas. As shown in FIG. 3, the gas delivery system 150 can include feed gas line(s) for delivery of an ozone gas (e.g. $O_3$), feed gas line(s) for delivery of a hydrogen containing gas (e.g., $H_2$, $CH_4$, or $NH_3$), and/or feed gas line(s) for delivery of an oxygen containing gas (e.g., $O_2$, NO, or $CO_2$). In some embodiments, the ozone gas, the hydrogen containing gas, and/or the oxygen containing gas can be mixed with an inert gas that can be called a "carrier" gas, such as He or Ar. A control valve and/or mass flow controller 158 can be used to control a flow rate of each feed gas line to flow a process gas into the plasma chamber 120.

Figure 4:
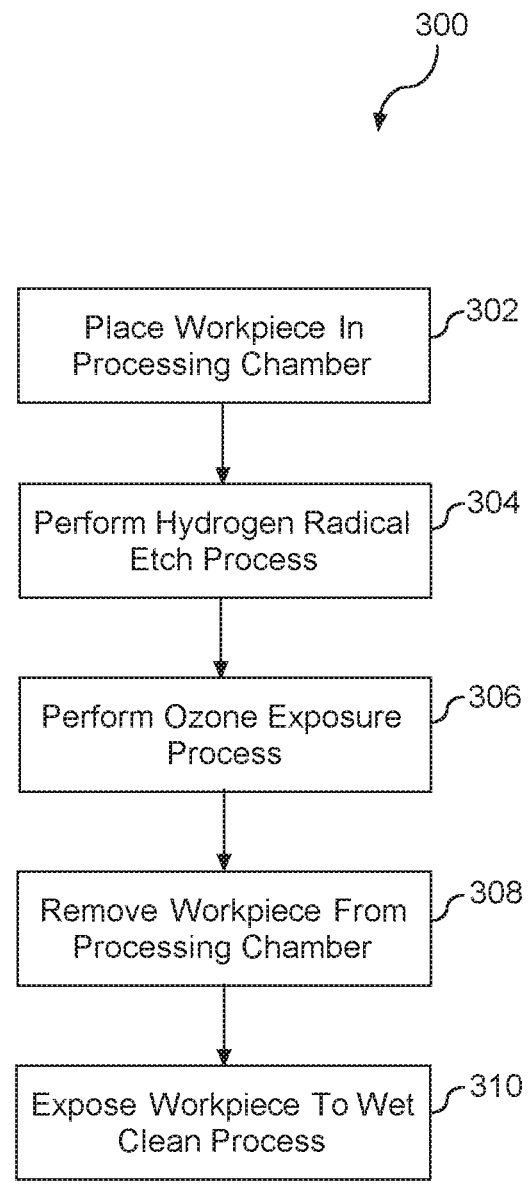
FIG. 4 depicts example flow diagram of an example photoresist removal process according to example embodiments of the present disclosure.

FIG. 4 depicts a flow diagram of one example method (300) according to example aspects of the present disclosure. The method (300) will be discussed with reference to the plasma processing apparatus 100 of FIG. 3 by way of example. The method (300) can be implemented in any suitable plasma processing apparatus. FIG. 4 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (302), the method can include placing a workpiece 114 in a processing chamber 110 of a plasma processing apparatus 100. The workpiece 114 can include a photoresist layer and a low-k dielectric material layer. The processing chamber 110 can be separated from a plasma chamber 120 (e.g., separated by a separation grid assembly). For instance, the method can include placing a workpiece 114 onto workpiece support 112 in the processing chamber 110. In embodiments, the method can include supporting the workpiece 114 on a workpiece support 112 in a processing chamber 110.

At (304), the method can include conducting a hydrogen radical etch process to remove the photoresist layer 76 from the workpiece 70. The method can include exposing one or more hydrogen radicals to the workpiece such that the one or more hydrogen radicals at least partially etches the photoresist layer. The hydrogen radical etch process can include admitting a process gas into the plasma chamber 120. For instance, a process gas can be admitted into the plasma chamber interior 125 from a gas source 150 via annular gas distribution channel 151 or other suitable gas introduction mechanism. In some embodiments, the process gas can include a hydrogen gas. In some embodiments, the process gas can include $H_2$ and another process gas, such as an oxygen ($O_2$). In certain embodiments, the concentration of hydrogen gas in the process gas is from about 30% to about 100% by volume. In embodiments where the process gas contains oxygen, the oxygen may be present in an amount of from about 0% to about 20% by volume. In some embodiments, the process gas comprises less than 10% by volume of oxygen ($O_2$). Still in some embodiments, the process gas comprises less than 5% by volume of oxygen ($O_2$).

The process gas is energized via an inductively coupled plasma source to generate a plasma in a plasma chamber 120. For instance, induction coil 130 can be energized with RF energy from RF power generator 134 to generate a plasma in the plasma chamber interior 125. In some embodiments, the inductively coupled plasma source can be energized with pulsed power to obtain desired radicals with reduced plasma energy. In some embodiments, the inductively coupled plasma source can be operated with a power in the range of about 660 W to about 5000 W. The plasma can be used to generate one or more hydrogen radicals from a hydrogen process gas. For example, one or more species can be generated from a process gas using a plasma induced in a plasma chamber. In embodiments, one or more hydrogen radicals are generated from a process gas using an inductively coupled plasma source.

The hydrogen radical etch process (304) can include filtering one or more species, such as one or more ions, generated by the plasma to create a filtered mixture. The filtered mixture can include neutral hydrogen radicals. In some embodiments, the one or more ions can be filtered using a separation grid assembly 200 separating the plasma chamber 120 from a processing chamber 110 where the workpiece is located. For instance, separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

The hydrogen radical etch process (304) can include exposing the workpiece to the hydrogen radicals. For example, the hydrogen radical etch process can include exposing the photoresist layer on the workpiece to the filtered mixture containing one or more hydrogen radicals. More particularly, the workpiece can be exposed to hydrogen radicals generated in the plasma and passing through the separation grid assembly. As an example, hydrogen radicals can pass through the separation grid 200 and be exposed to the workpiece 114. Exposing the workpiece to hydrogen radicals can result in removal of at least a portion of the photoresist layer 76 from the workpiece.

The hydrogen radical etch process (304) can be implemented by generating hydrogen radicals using other approaches without deviating from the scope of the present disclosure. For instance, in some embodiments, the hydrogen radicals can be generated at least in part using post-plasma gas injection (as discussed with reference to FIG. 5) and/or a heated filament (see FIG. 6).

At (306), the method can include exposing the workpiece to an ozone process gas. For example, the method can include admitting an ozone process gas into the processing chamber and exposing the workpiece to the ozone process gas. The method may also include exposing the workpiece to an ozone process gas such that the ozone process gas at least partially etches the photoresist layer on the workpiece. In some embodiments, the ozone process gas can include ozone gas ($O_3$) and oxygen (Oz). In certain embodiments, the ozone gas is present in the ozone process gas in an amount of from about 0.5% to about 20% by volume. In some embodiments, ozone gas can be delivered into the plasma chamber 120 and can pass through the separation grid 200 to reach the workpiece 114. For example, the ozone gas may be delivered into the plasma chamber 120 via a suitable gas supply 150 and annular gas distribution channel 151. In some embodiments, ozone gas can be delivered into the processing chamber 110 via the separation grid 200 or below the separation grid 200 so that the ozone gas is injected downstream of the plasma source. In embodiments, ozone process gas is admitted through one or more gas injection ports in the separation grid. In other embodiments, ozone process gas is admitted through one or more gas injection ports in the processing chamber. The workpiece 114 can include a photoresist layer 76 and a low-k dielectric material layer 74. The ozone gas can react with the exposed surface of the photoresist layer 76 to remove the photoresist layer 76 from the workpiece 114.

In some embodiments, a cyclic ozone gas exposure process (306) and hydrogen radical etch process (304) can be conducted to improve the etch selectivity for the photoresist layer 76 compared to the low-k dielectric material layer 74. For instance, the hydrogen radical etch process (304) can be conducted and then the ozone gas exposure (306) can be conducted then; then ozone gas exposure (306) and subsequent hydrogen radical etch process (304) can be conducted again. The hydrogen radical etch process (304) and ozone gas exposure (306) treatment can be cycled for one or multiple times to reach a target etch amount for the photoresist layer. For example, embodiments include alternating exposing the workpiece to the one or more hydrogen radicals and exposing the workpiece to the ozone process gas.

In some embodiments, the hydrogen radical etch process (304) can be performed without the ozone gas exposure (306). In some embodiments, the ozone gas exposure (306) can be performed without the hydrogen radical etch process (304). In some embodiments, the hydrogen radical etch process (304) and/or the ozone gas exposure (306) can be used in combination with other strip processes, such as oxygen or nitrogen plasma based photoresist strip processes.

At (310) the method can include removing the workpiece from the processing chamber. For instance, the workpiece 114 can be removed from workpiece support 112 in the processing chamber 110. The plasma processing apparatus can then be conditioned for future processing of additional workpieces.

In some embodiments, the workpiece 114 can be subjected to an optional wet clean process, such as exposure to diluted hydrofluoric acid during a diluted hydrofluoric acid wet process. For example, the method can include exposing the workpiece to a diluted hydrofluoric acid wet process. In some embodiments, the workpiece 144 may be subjected to the wet clean process after (310) removal of the workpiece 114 from the processing chamber 110.

Figure 5:
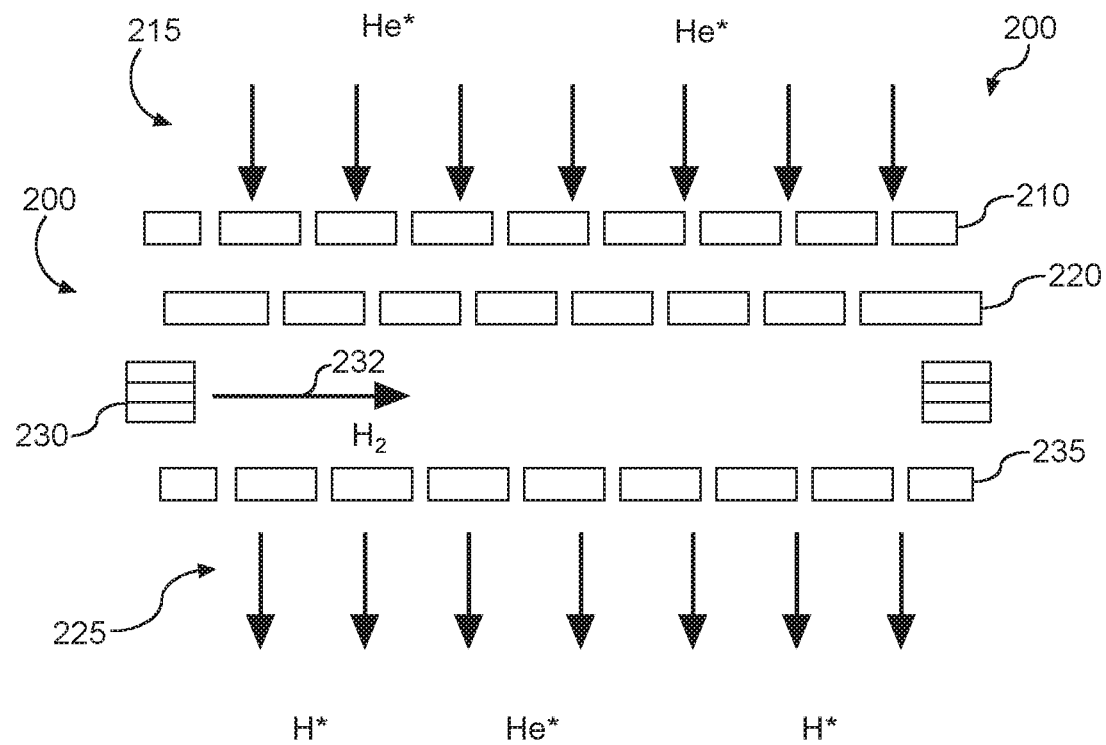
FIG. 5 depicts example generation of hydrogen radicals using post-plasma gas injection according to example embodiments of the present disclosure.

FIG. 5 depicts example generation of hydrogen radicals using post-plasma gas injection according to example embodiments of the present disclosure. More particularly, FIG. 5 depicts an example separation grid 200 for injection of hydrogen post-plasma according to example embodiments of the present disclosure. More particularly, the separation grid 200 includes a first grid plate 210 and a second grid plate 220 disposed in parallel relationship. The first grid plate 210 and the second grid plate 220 can provide for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Species (e.g., excited inert gas molecules) 215 from the plasma can be exposed to the separation grid 200. Charged particles (e.g., ions) can recombine on the walls in their path through the holes of each grid plate 210, 220 in the separation grid 200. Neutral species can flow relatively freely through the holes in the first grid plate 210 and the second grid plate 220.

Subsequent to the second grid plate 220, a gas injection source 230 can be configured to mix hydrogen 232 into the species passing through the separation grid 200. A mixture 225 including hydrogen radicals resulting from the injection of hydrogen gas can pass through a third grid plate 235 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the hydrogen can be mixed with the species at any point in the separation grid and/or after the separation grid in the processing chamber. For instance, the gas injection source 230 can be located between first grid plate 210 and second grid plate 220.

Figure 6:
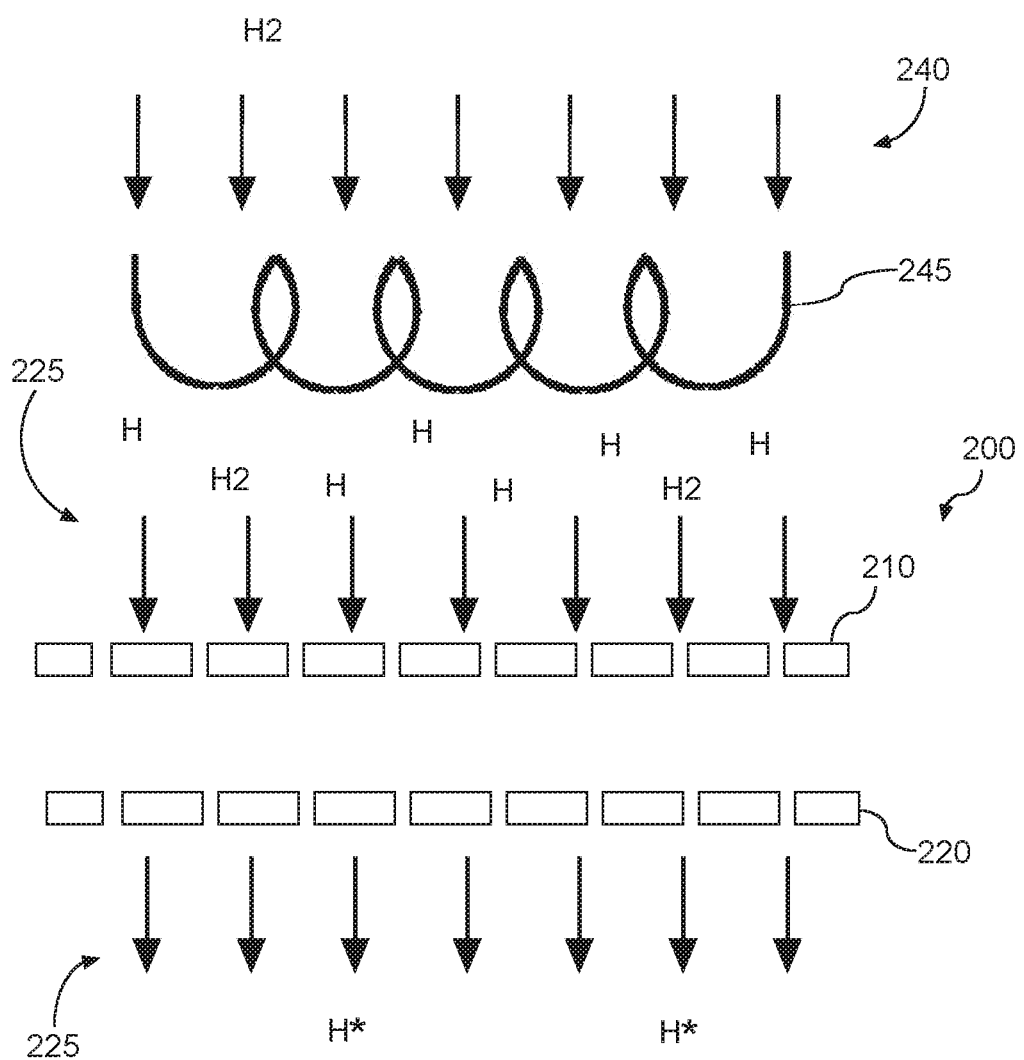
FIG. 6 depicts example generation of hydrogen radicals using a filament according to example embodiments of the present disclosure.

In some embodiments, one or more hydrogen radicals are generated using a tungsten filament. For example, the hydrogen radicals can be generated by passing a hydrogen gas over a heated filament (e.g., a tungsten filament). As shown in FIG. 6, a hydrogen gas $H_2$ 240 can be passed over a heated filament 245 (e.g., a tungsten filament) to generate hydrogen radicals 225 in a first chamber. The hydrogen radicals 225 can be passed through a separation grid 200.

The separation grid 200 includes a first grid plate 210 and a second grid plate 220 disposed in parallel relationship. The first grid plate 210 can have a first grid pattern having a plurality of holes. The second grid plate 220 can have a second grid pattern having a plurality of holes. The first grid pattern can be the same as or different from the second grid pattern.

The plasma strip process can be implemented using other plasma processing apparatus without deviating from the scope of the present disclosure.

Figure 7:
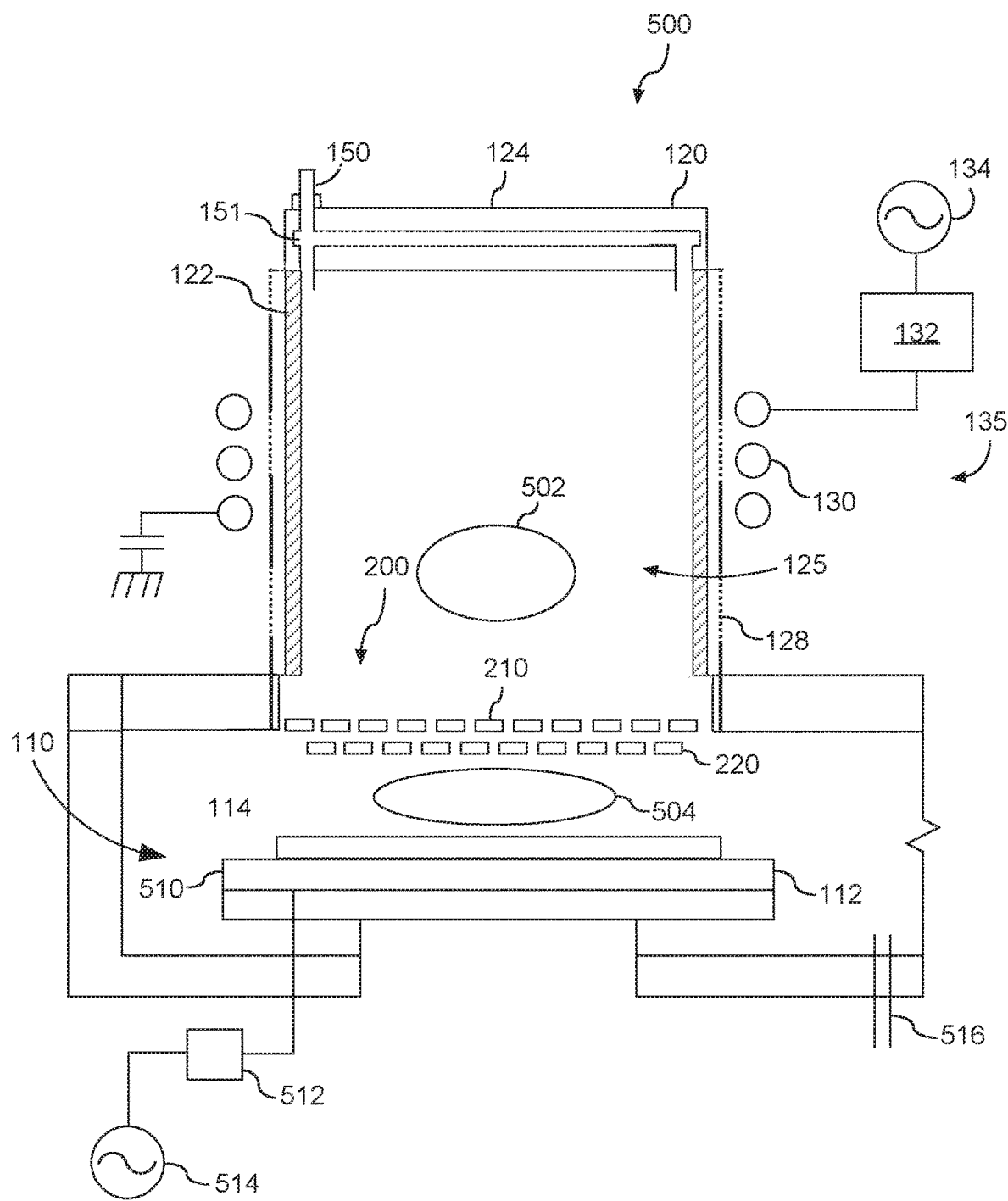
FIG. 7 depicts an example plasma processing apparatus according to example embodiments of the present disclosure.

FIG. 7 depicts an example plasma processing apparatus 500 that can be used to implement processes according to example embodiments of the present disclosure. The plasma processing apparatus 500 is similar to the plasma processing apparatus 100 of FIG. 3.

More particularly, plasma processing apparatus 500 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 7, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

As discussed above, a hydrogen gas can be injected into species passing through the separation grid 200 to generate one or more hydrogen radicals for exposure to the workpiece 114. The hydrogen radicals can be used to implement a variety of semiconductor fabrication processes.

The example plasma processing apparatus 500 of FIG. 7 is operable to generate a first plasma 502 (e.g., a remote plasma) in the plasma chamber 120 and a second plasma 504 (e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 500 of FIG. 7 includes a bias source having bias electrode 510 in the pedestal 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The processing chamber 110 can include a gas exhaust port 516 for evacuating a gas from the processing chamber 110. The hydrogen radicals used in the hydrogen radical etch process according to example aspects of the present disclosure can be generated using the first plasma 502 and/or the second plasma 504.

Figure 8:
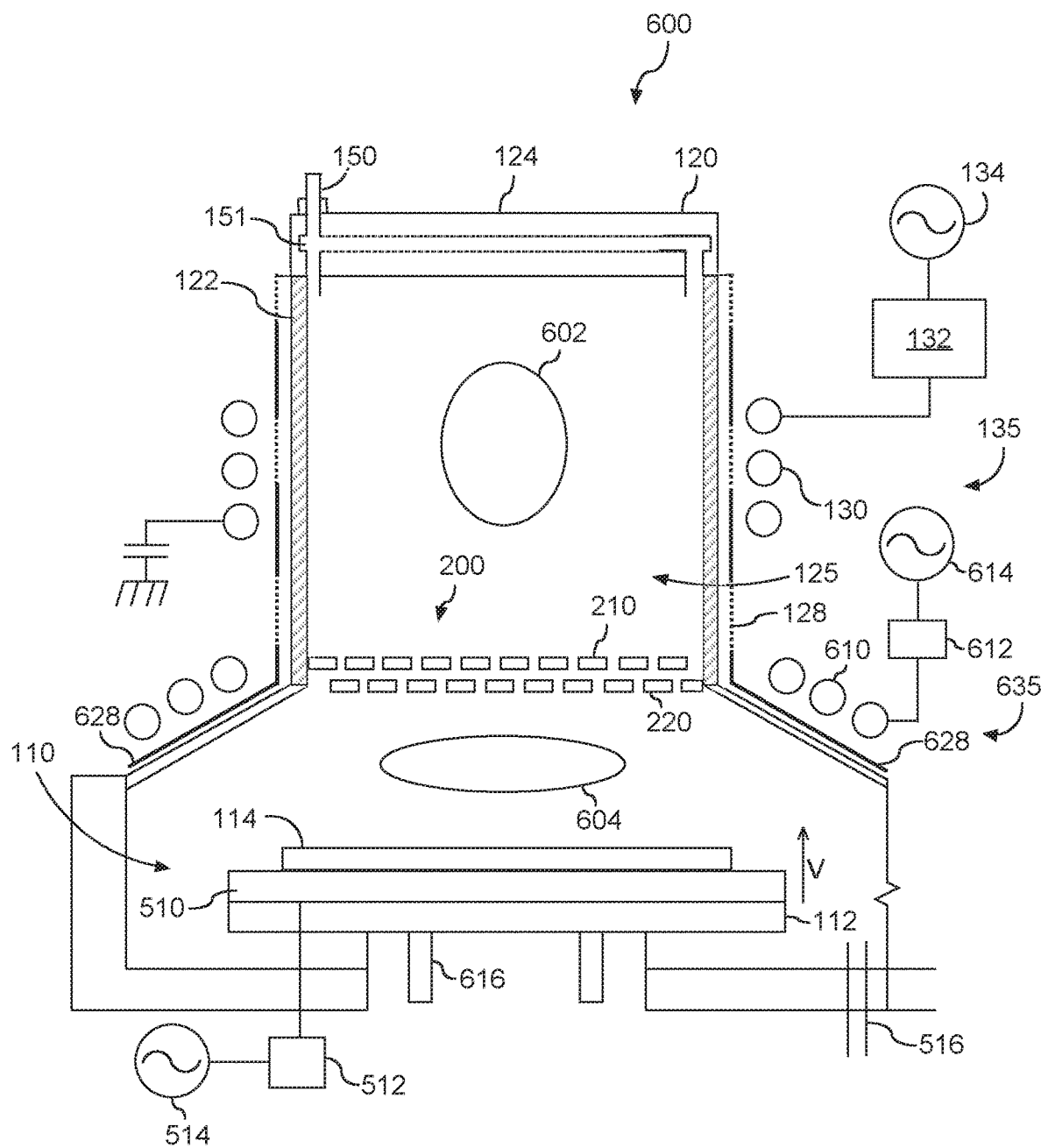
FIG. 8 depicts an example plasma processing apparatus according to example embodiments of the present disclosure.

FIG. 8 depicts a processing chamber 600 similar to that of FIG. 2 and FIG. 7. More particularly, plasma processing apparatus 600 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 8, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 600 of FIG. 8 is operable to generate a first plasma 602 (e.g., a remote plasma) in the plasma chamber 120 and a second plasma 604 (e.g., a direct plasma) in the processing chamber 110. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can be located proximate the dielectric sidewall 622. The second inductive plasma source 635 can include an induction coil 610 coupled to an RF generator 614 via a suitable matching network 612. The induction coil 610, when energized with RF energy, can induce a direct plasma 604 from a mixture in the processing chamber 110. A Faraday shield 628 can be disposed between the induction coil 610 and the sidewall 622.

The pedestal 112 can be movable in a vertical direction V. For instance, the pedestal 112 can include a vertical lift 616 that can be configured to adjust a distance between the pedestal 112 and the separation grid assembly 200. As one example, the pedestal 112 can be located in a first vertical position for processing using the remote plasma 602. The pedestal 112 can be in a second vertical position for processing using the direct plasma 604. The first vertical position can be closer to the separation grid assembly 200 relative to the second vertical position.

The plasma processing apparatus 600 of FIG. 8 includes a bias source having bias electrode 510 in the pedestal 112. The bias electrode 510 can be coupled to an RF power generator 514 via a suitable matching network 512. The processing chamber 110 can include a gas exhaust port 516 for evacuating a gas from the processing chamber 110. The hydrogen radicals used in the photoresist etch processes according to example aspects of the present disclosure can be generated using the first plasma 602 and/or the second plasma 604.

Example process parameters for the hydrogen radical etch process will now be set forth.

Example 1

Process Gas: $H_2$, $O_2$
Dilution Gas: He
Process Pressure: 100 mT to 10 T
Inductively Coupled Plasma Source Power: 500 W to 4500 W
Workpiece Temperature: 60 C to 400 C
Process Period (time): 30 sec to 300 sec
Gas Flow Rates for Process Gas:
Gas 1: H2 from 200 sccm to 20000 sccm
Gas 2: O2 from 0 sccm to 20000 sccm
Dilution Gas: 1000 sccm to 20000 sccm Example process parameters for the ozone gas exposure process will now be set forth.

Example 2

Figure 9:
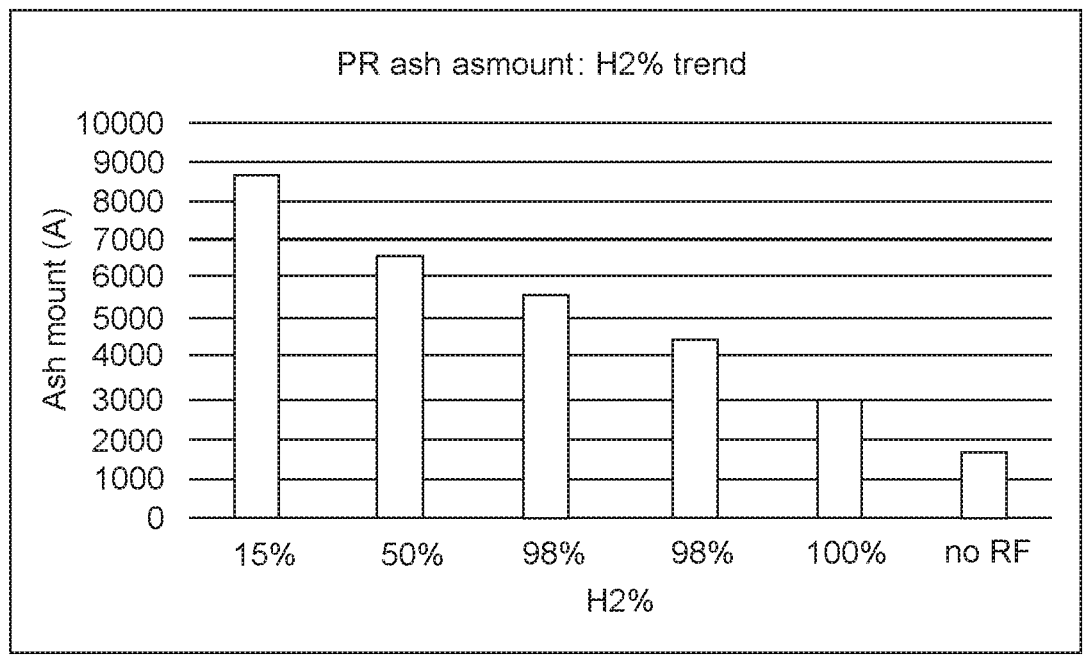
FIG. 9 illustrates photoresist ash amounts after exposure to hydrogen radicals.

Process Gas: $O_3$
Dilution Gas: $O_2$
Process Pressure: 100 mT to 20 T
Inductively Coupled Plasma Source Power: No
Workpiece Temperature: 60 C to 400 C
Process Period (time): 30 sec to 600 sec
Gas Flow Rates for Process Gas:
Gas 1: 10 sccm to 1000 sccm
Dilution Gas: 1000 sccm to 25000 sccm FIG. 9 illustrates the photoresist ash amounts when exposed to radicals generated from a plasma containing $H_2$ and $O_2$. As shown, the amount of $H_2$ by volume in the plasma varies from 15% to up to 100% by volume. As shown, the ash amount is greater than 8000 Angstroms when a photoresist layer is exposed to hydrogen radicals generated from a process gas containing about 15% $H_2$ by volume. The ash amount of the photoresist material decreases as the amount of $H_2$ is increased in the process gas used to generate the plasma.

Figure 10A:
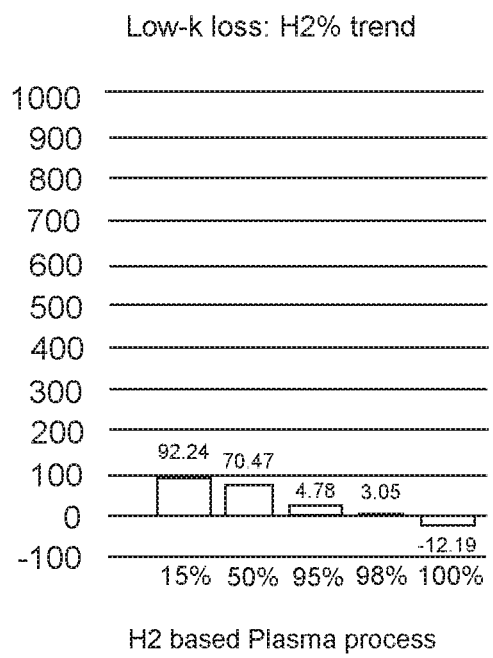
FIGS. 10A and 10B illustrate low-k material layer loss when exposed to hydrogen radicals.
Figure 10B:
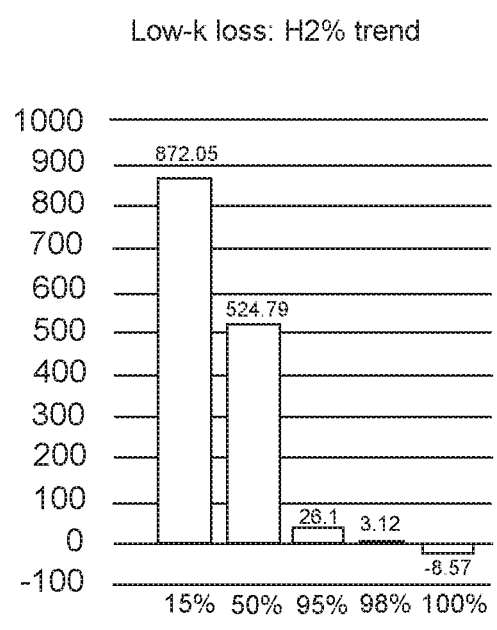

FIG. 10A illustrates low-k material layer loss when exposed to radicals generated from a plasma containing Hz and $O_2$. The amount of $H_2$ by volume in the plasma varies from 15% to up to 100% by volume. As shown, when the hydrogen radicals are generated from a plasma having a process gas containing 15% by volume $H_2$, approximately 92.24 Angstroms of low-k material is lost from the low-k dielectric layer. However, as the volume percent of hydrogen is increased in the plasma gas, the amount of loss of low-k dielectric material decreases. Stated differently, increasing the volume percentage of hydrogen in the plasma process gas causes less damage and loss of the low-k dielectric material. For example, when the low-k dielectric material is subjected to radicals generated from a process gas containing 98% $H_2$ by volume, only 3.05 Angstroms of low-k dielectric material are lost/removed. Similarly, FIG. 10B illustrates the Angstrom amount of low-k dielectric material layer loss after a hydrogen radical etch process followed by a diluted hydrofluoric acid wet cleaning process. As shown, use of higher concentrations of hydrogen gas for the generation of H radicals can lead to reduced low-k loss, even after performance of a wet clean process.

Figure 11A:
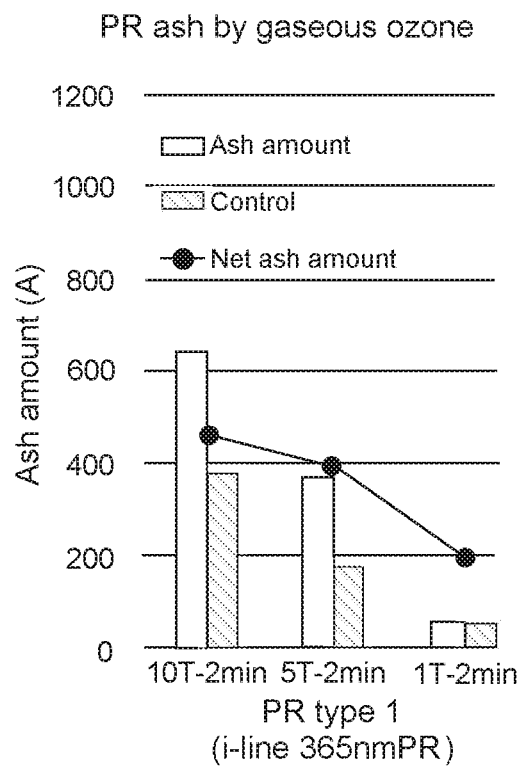
FIGS. 11A and 11B illustrate photoresist ash amounts after exposure to an ozone process gas.
Figure 11B:
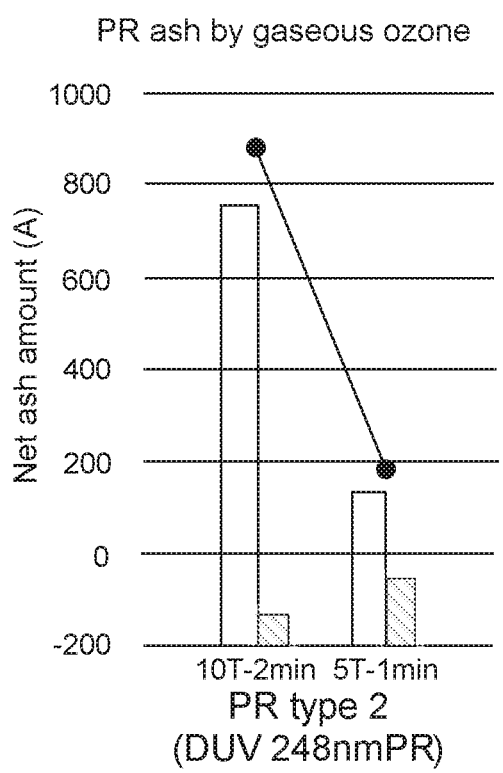

FIG. 11A illustrates the ash amount of PR type 1 (i-line 365 nm PR) after exposure to an ozone process gas containing a combination of both $O_3$ and Oz gases. The control bar represents exposure to oxygen ($O_2$) gas only. Accordingly, the net ash amount corresponds to the ash amount provided by the combination of both $O_3$ and $O_2$ gases minus the ash amount provided solely by $O_2$ gas. FIG. 11B illustrates the same principles as FIG. 11A, however, the photoresist material is PR type 2 (DUV 248 nm PR).

Figure 12:
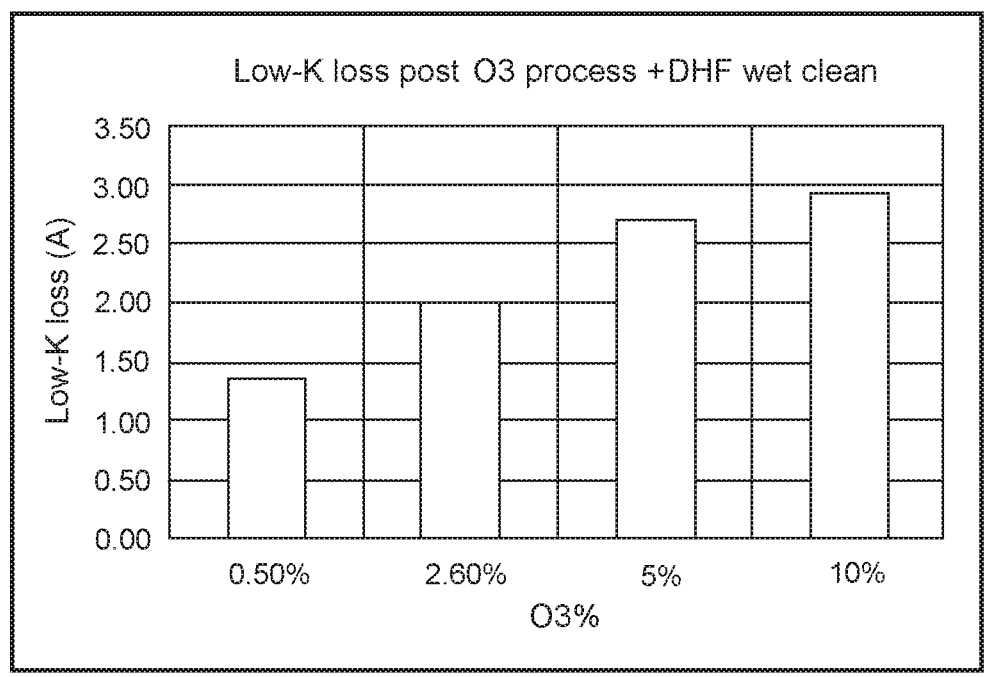
FIG. 12 illustrates low-k dielectric material loss following exposure to an ozone process gas.

FIG. 12 illustrates low-k dielectric material loss following exposure to an ozone process gas containing a combination of both $O_3$ and $O_2$ gases followed by a diluted hydrofluoric acid wet cleaning process. As shown, exposure of the low-k dielectric material to an ozone process gas containing 0.50% $O_3$ results in a low-k dielectric material loss of between 1.00 and 1.50 Angstroms. While exposure of the low-k dielectric material to an ozone process gas containing 10% $O_3$ results in a low-k dielectric material loss of between 2.5 and 3.0 Angstroms While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the method comprising:
    placing the workpiece in a processing chamber, the workpiece comprising a photoresist layer and a low-k dielectric material layer;
    generating one or more species from a process gas using a plasma induced in a plasma chamber, the process gas comprising a hydrogen gas;
    filtering the one or more species to create a filtered mixture, the filtered mixture comprising one or more hydrogen radicals;
    exposing the photoresist layer to the hydrogen radicals in the processing chamber such that the hydrogen radicals at least partially etch the photoresist layer; and
    alternating exposing the workpiece to the one or more hydrogen radicals and exposing the workpiece to the ozone process gas.

2. The method of claim 1, wherein the process gas further comprises an oxygen containing gas.

3. The method of claim 1, wherein a concentration of hydrogen gas in the process gas is from about 30% to about 100% by volume.

4. The method of any of claim 1, further comprising exposing the workpiece to a diluted hydrofluoric acid wet process.

5. The method of claim 1, wherein the one or more hydrogen radicals are generated from a process gas using an inductively coupled plasma source.

6. The method of claim 1, wherein the one or more hydrogen radicals are generated using a tungsten filament.

7. The method of claim 1, wherein the one or more hydrogen radicals are generated by mixing a hydrogen gas with one or more excited inert gas molecules downstream of a plasma source.

8. A method for processing a workpiece, the method comprising:
    placing the workpiece in a processing chamber, the workpiece comprising a photoresist layer and a low-k dielectric material layer;
    admitting an ozone process gas into the processing chamber;
    exposing the workpiece to the ozone process gas such that the ozone process gas at least partially etches the photoresist layer;
    conducting a hydrogen radical etch process on the photoresist layer, the hydrogen radical etch process comprising:
        generating one or more species from a process gas using a plasma induced in a plasma chamber
        filtering the one or more species to create a filtered mixture, the filtered mixture comprising one or more hydrogen radicals; and
        exposing the workpiece to the one or more hydrogen radicals in the processing chamber such that the filtered mixture at least partially etches the photoresist layer; and
    alternating exposing the workpiece to the ozone process gas and conducting the hydrogen radical etch process.

9. The method of claim 8, wherein the ozone process gas comprises an ozone gas and oxygen.

10. The method of claim 8, wherein a concentration of the ozone gas in the ozone process gas is in the range of about 0.5% to about 20% by volume.

11. The method of claim 1, further comprising admitting an ozone process gas into the processing chamber; and exposing the workpiece to the ozone process gas.

12. The method of claim 11, wherein the processing chamber and plasma chamber are separated by a separation grid, further wherein the ozone process gas is admitted through one or more gas injection ports in the separation grid.

13. The method of claim 11, wherein the processing chamber and plasma chamber are separated by a separation grid, further wherein admitting an ozone process gas into the processing chamber comprises admitting the ozone process gas into the plasma chamber and allowing the ozone process gas to flow through the separation grid to the processing chamber.

14. The method of claim 11, wherein the ozone process gas is admitted through one or more gas injection ports in the processing chamber.

15. The method of claim 11, wherein the ozone process gas comprises an ozone gas and an oxygen gas.

16. The method of claim 15, wherein a concentration of ozone gas in the ozone process gas is in the range of about 0.5% to about 20% by volume.

* * * * *